(12) United States Patent
Wada et al.

(10) Patent No.: US 12,344,174 B2
(45) Date of Patent: Jul. 1, 2025

(54) PARTITIONED JUNCTION BOX WITH TWO INTERCONNECTED LIDS

(71) Applicant: Yazaki Corporation, Tokyo (JP)

(72) Inventors: Masahiro Wada, Makinohara (JP); Takaaki Kakimi, Makinohara (JP); Kazuki Shoji, Makinohara (JP); Kengo Aono, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 348 days.

(21) Appl. No.: 18/134,391

(22) Filed: Apr. 13, 2023

(65) Prior Publication Data
US 2023/0365079 A1   Nov. 16, 2023

(30) Foreign Application Priority Data

May 16, 2022   (JP) .................. 2022-080290

(51) Int. Cl.
*B60R 16/023* (2006.01)
*H05K 5/03* (2006.01)
*H05K 5/06* (2006.01)

(52) U.S. Cl.
CPC .......... *B60R 16/0239* (2013.01); *H05K 5/03* (2013.01); *H05K 5/06* (2013.01)

(58) Field of Classification Search
CPC .... H02G 3/14; B60R 16/0239; B60R 16/0238
See application file for complete search history.

(56) References Cited

U.S. PATENT DOCUMENTS

| | | | | |
|---|---|---|---|---|
| 4,979,209 | A * | 12/1990 | Collins | H04Q 1/116 379/442 |
| 7,172,440 | B2 * | 2/2007 | Kanamaru | H01R 13/447 439/949 |
| 8,163,994 | B2 * | 4/2012 | Taniguchi | H02G 3/081 174/559 |
| 11,205,889 | B2 * | 12/2021 | Kurata | H02G 3/081 |
| 11,380,508 | B2 * | 7/2022 | Kurata | B60R 16/0239 |
| 11,600,977 | B2 * | 3/2023 | Kakimi | H02G 3/081 |
| 11,713,009 | B2 * | 8/2023 | Kurata | B60R 16/0238 439/76.2 |
| 12,046,885 | B2 * | 7/2024 | Mita | H02G 3/14 |
| 2020/0294749 | A1 | 9/2020 | Kurata et al. | |
| 2020/0295548 | A1 | 9/2020 | Kurata et al. | |
| 2021/0078513 | A1 | 3/2021 | Kurata et al. | |
| 2023/0117716 | A1 * | 4/2023 | Wada | H05K 5/0217 361/679.01 |

FOREIGN PATENT DOCUMENTS

| | | |
|---|---|---|
| JP | 2020-150595 A | 9/2020 |
| JP | 2020-150596 A | 9/2020 |
| JP | 2021-044944 A | 3/2021 |
| JP | 2021-045019 A | 3/2021 |

* cited by examiner

*Primary Examiner* — Vanessa Girardi
(74) *Attorney, Agent, or Firm* — Sughrue Mion, PLLC

(57) ABSTRACT

An electric junction box is provided. A second upper cover includes a second body wall covering an upper opening of a housing on a side rearward of a first partition wall, and a first waterproof rib standing upward from a front end of the second body wall. The first waterproof rib is arranged between the first partition wall and a first peripheral wall. The second upper cover includes a second waterproof rib standing upward from the second body wall. The second waterproof rib is arranged rearward of the first peripheral wall.

5 Claims, 9 Drawing Sheets

PARTITIONED JUNCTION BOX WITH TWO INTERCONNECTED LIDS

CROSS-REFERENCE TO RELATED APPLICATIONS

This application is based on and claims priority under 35 USC 119 from Japanese Patent Application No. 2022-080290 filed on May 16, 2022, the contents of which are incorporated herein by reference.

TECHNICAL FIELD

The present invention relates to an electric junction box.

BACKGROUND ART

As the above-described electric junction box, there has been an electric junction box including a housing for accommodating an electronic component such as a fuse, and two lids for covering an opening of the housing, that is, a first lid and a second lid (Patent Literature 1 to 4).

However, when water flows from the first lid toward the second lid, the water hits the component provided on the upper side of the second lid, and is repelled back by the second lid. The water repelled back by the second lid flows toward the first lid and enters the interior of the housing through the gap between the first lid and the housing.

CITATION LIST

Patent Literature

Patent Literature 1: JP 2020-150595A
Patent Literature 2: JP 2020-150596A
Patent Literature 3: JP 2021-44944A
Patent Literature 4: JP 2021-45019A

SUMMARY OF INVENTION

The present invention has been made in view of the above-described circumstances, and an object of the present invention is to provide an electric junction box that prevents water from entering a housing.

Solution to Problem

In order to achieve the above object, an electric junction box according to the present invention is characterized as follows. The electric junction box includes a housing including a housing body having an opening, and a first partition wall partitioning an interior of the housing body into two areas parallel in a partition direction; a first lid including a first body wall covering the opening on one side in the partition direction with respect to the first partition wall, and a first peripheral wall standing toward the housing from a peripheral edge of the first body wall, the first peripheral wall being arranged on the other side in the partition direction with respect to the first partition wall; a second lid including a second body wall covering the opening on the other side in the partition direction with respect to the first partition wall, and a first upright wall standing away from the housing from an edge of the second body wall on the one side in the partition direction, the first upright wall being provided between the first partition wall and the first peripheral wall in the partition direction. The second lid includes a second upright wall standing away from the housing from the second body wall, and the second upright wall is arranged on the other side in the partition direction with respect to the first peripheral wall.

According to the present invention, it is possible to provide an electric junction box that prevents water from entering a housing.

The present disclosure has been briefly described above. Further, details of the present disclosure will be further clarified by reading through a mode for carrying out the invention described below (hereinafter referred to as an "embodiment") with reference to the accompanying drawings.

BRIEF DESCRIPTION OF DRAWINGS

Exemplary embodiments of the present invention will be described in detail based on the following figures, wherein.

DESCRIPTION OF EMBODIMENTS

Specific embodiments of the present invention will be described below with reference to the drawings. An electric junction box 1 houses electronic components and is provided in an engine room of a vehicle.

Hereinafter, for convenience of description, "front (F)", "back (B)", "left (L)", "right (R)", "upper (U)", and "down (D)" are defined as illustrated in FIGS. 1 to 9. The "front-back direction", the "left-right direction", and the "upper-down direction" are orthogonal to each other. The front-back direction corresponds to the "partition direction" of the present invention, the front side corresponds to the "one side in the partition direction" of the present invention, and the rear side corresponds to the "other side in the partition direction" of the present invention. The left-right direction corresponds to the "intersecting direction" of the present invention. Upward in the upper-down direction corresponds to "away from the housing" in the present invention, and downward corresponds to "toward the housing" in the present invention.

Figure 1:
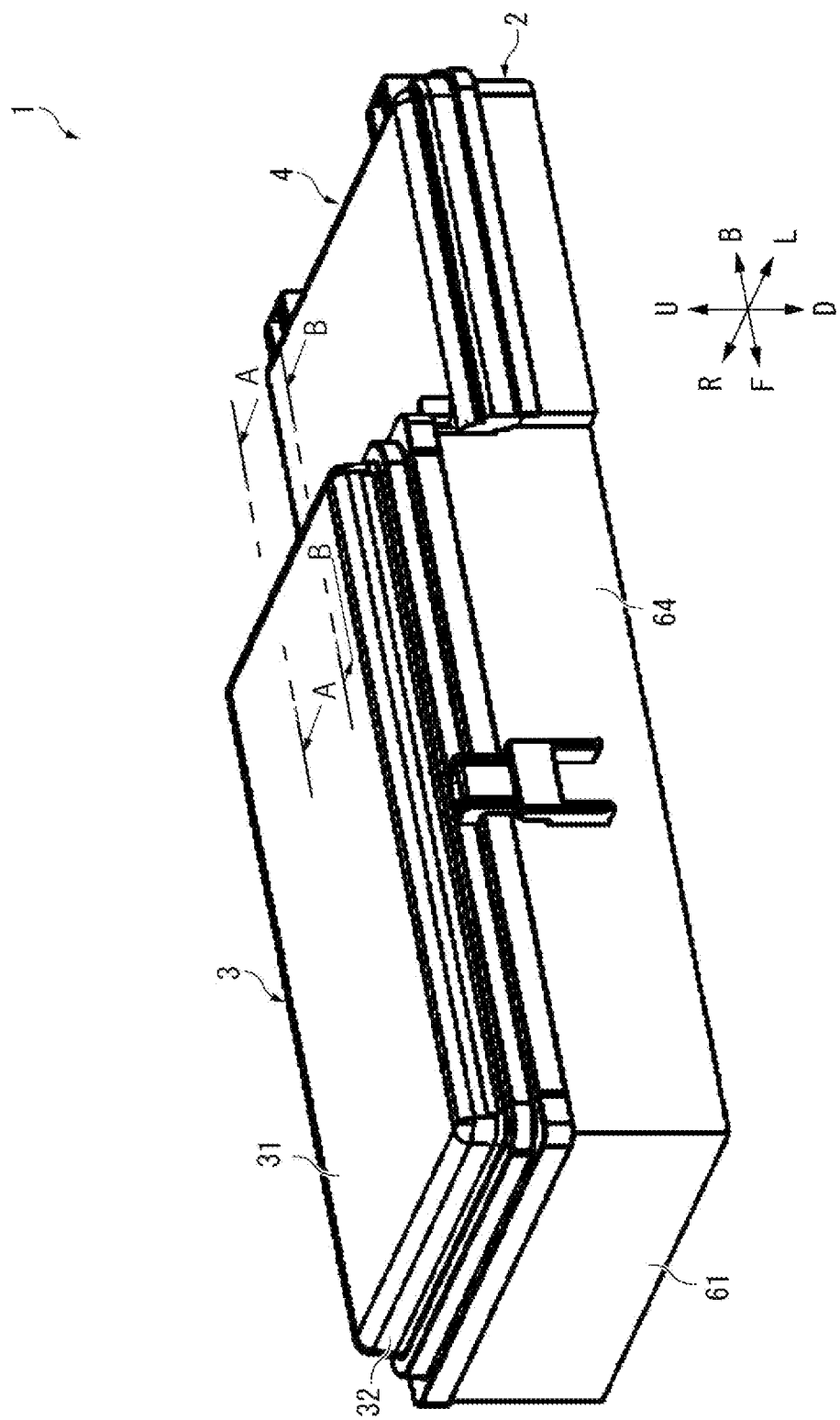
FIG. 1 is a perspective view of an electric junction box according to the present invention.
Figure 2:
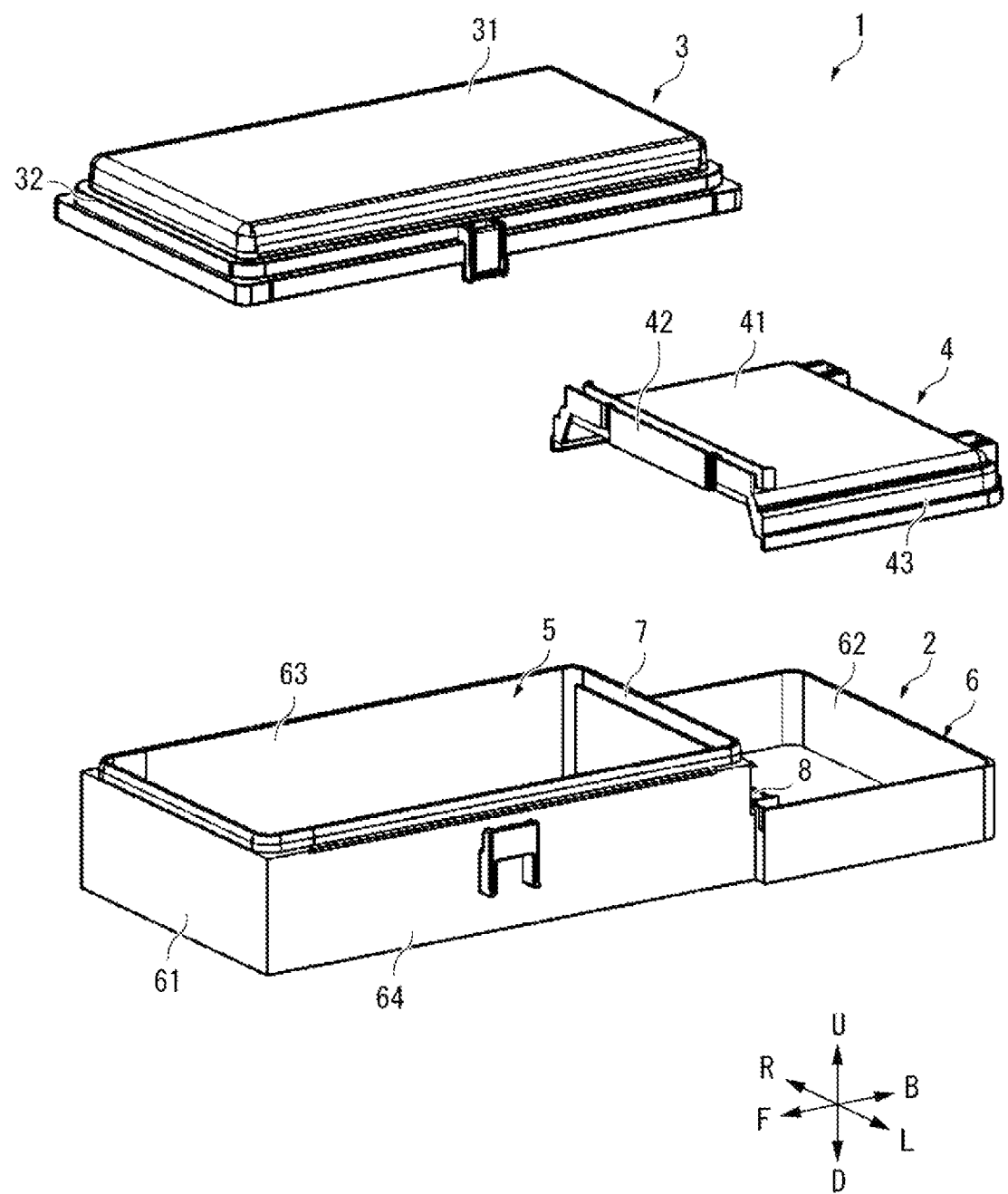
FIG. 2 is an exploded perspective view of the electric junction box illustrated in FIG. 1.

As illustrated in FIG. 1, the electric junction box 1 includes a housing 2 provided with an upper opening 5 (see FIG. 2) and a lower opening (not illustrated), a first upper cover 3 (first lid) and a second upper cover 4 (second lid) that close the upper opening 5 of the housing 2, and a lower cover (not illustrated) that closes the lower opening of the housing 2. As illustrated in FIG. 2, the housing 2 includes a housing body 6 having a substantially rectangular tube shape provided with an upper opening 5, and a first partition wall 7 and a second partition wall 8 that partition the inside of the housing body 6 into two areas parallel to each other in the front-back direction. The two areas of the housing body 6 accommodate electronic components such as relays and fuses.

Figure 3:
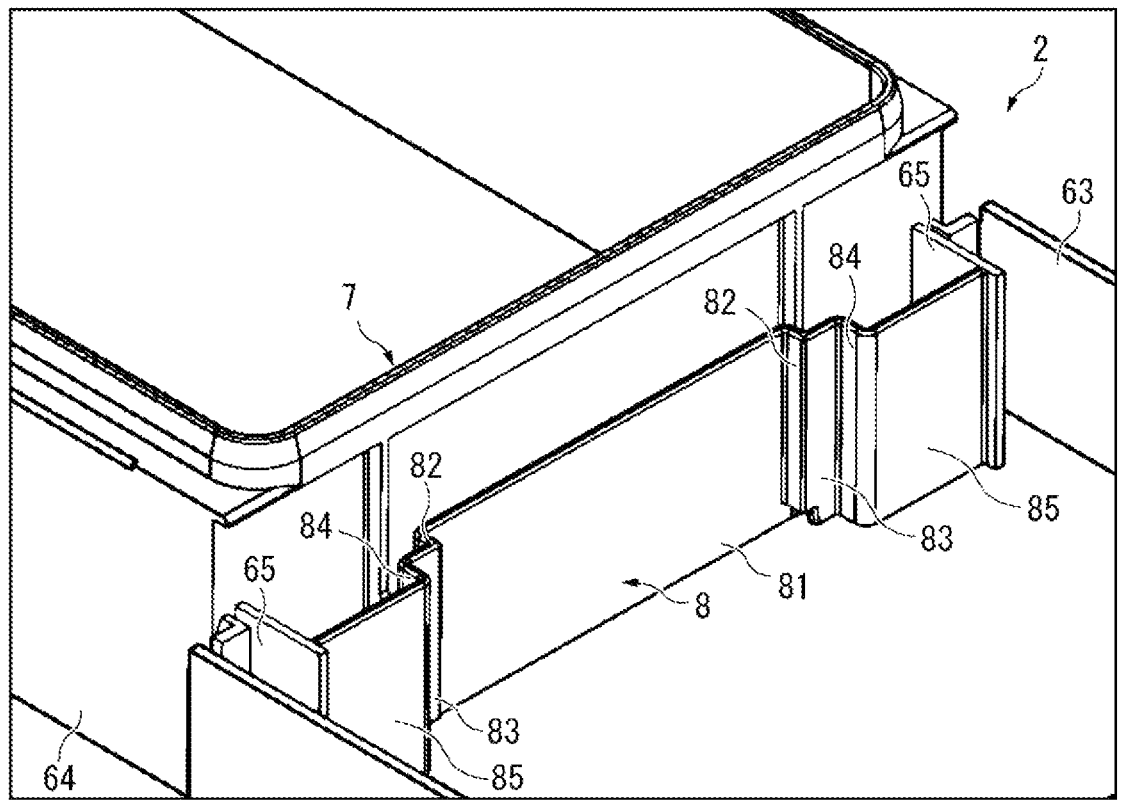
FIG. 3 is a partial perspective view of a first partition wall and a second partition wall constituting a housing illustrated in FIG. 1.
Figure 3:
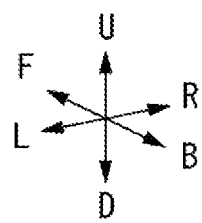

The housing body 6 includes a front wall 61 and a rear wall 62 extending in the left-right direction and facing each other in the front-back direction, and a right wall 63 and a left wall 64 extending in the front-back direction and facing each other in the left-right direction. The front wall 61 is provided between the front ends of the right wall 63 and the left wall 64. The rear wall 62 is provided between the rear ends of the right wall 63 and the left wall 64. As illustrated in FIG. 3, the first partition wall 7 and the second partition wall 8 extend in the left-right direction and face each other in the front-back direction.

As illustrated in FIG. 2, the upper ends of the front wall 61, the first partition wall 7, and the right wall 63 and the left wall 64 forward of the first partition wall 7 are provided at the same position in the upper-down direction. The upper ends of the rear wall 62, the second partition wall 8, and the right wall 63 and the left wall 64 rearward of the first partition wall 7 are provided at the same position in the upper-down direction. The upper ends of the front wall 61, the first partition wall 7, and the right wall 63 and the left wall 64 forward of the first partition wall 7 protrude upward of the upper ends of the rear wall 62, the second partition wall 8, and the right wall 63 and the left wall 64 rearward of the first partition wall 7.

The first partition wall 7 extends from the right wall 63 to the left wall 64. The second partition wall 8 is arranged rearward of the first partition wall 7. As illustrated in FIG. 3, the second partition wall 8 stands rearward from the first partition wall 7 and is provided between a pair of first ribs 65, 65 facing each other in the left-right direction. Two areas partitioned in the front-back direction are provided, that is, the front side of the first partition wall 7 and the rear side of the second partition wall 8.

Figure 4:
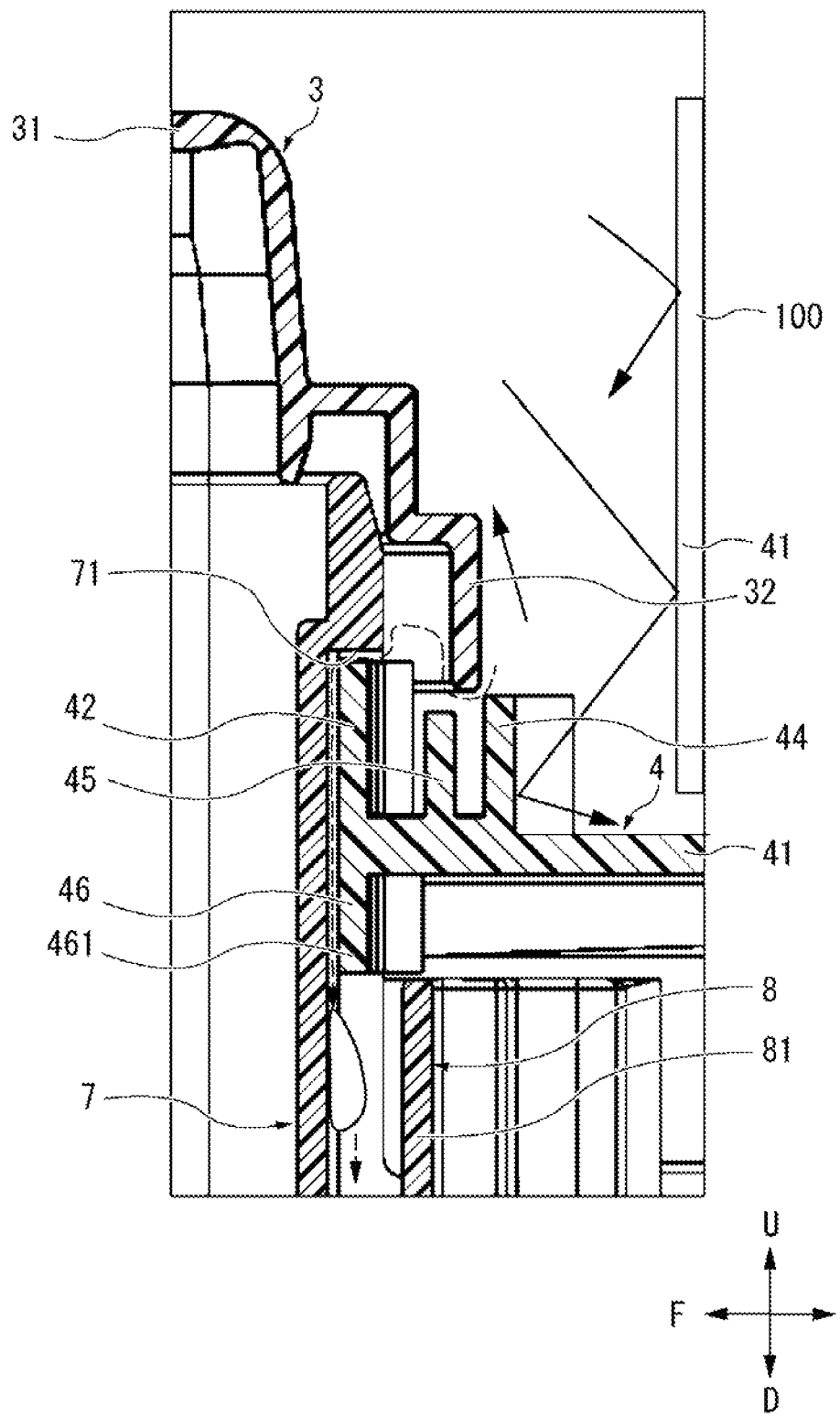
FIG. 4 is a cross-sectional view taken along line A-A of FIG. 1.

As illustrated in FIG. 4, the first partition wall 7 includes an upper end protruding rearward of the lower side, thereby provided with a stepped wall 71.

As illustrated in FIG. 3, the second partition wall 8 includes a central wall 81, a pair of first stepped walls 82, 82, a pair of walls 83, 83, a pair of second stepped walls 84, 84, and a pair of end walls 85, 85. The central wall 81 is provided at the center in the left-right direction of the second partition wall 8. The pair of first stepped walls 82, 82 stand backward from both ends in the left-right direction of the central wall 81. The pair of walls 83, 83 stand outward in the left-right direction from the back ends of the pair of first stepped walls 82, 82. The pair of second stepped walls 84, 84 stand backward from the outer ends in the left-right direction of the pair of walls 83, 83. The pair of end walls 85, 85 are provided at both ends in the left-right direction of the second partition wall 8, and stand outward in the left-right direction from the back ends of the pair of second stepped walls 84, 84.

The gap between the first partition wall 7 and the central wall 81 is the narrowest, the gap between the first partition wall 7 and the pair of walls 83, 83 is the second narrowest, and the gap between the first partition wall 7 and the pair of end walls 85, 85 is the widest. That is, the gap between the first partition wall 7 and the second partition wall 8 is wider at both ends in the left-right direction than at the center in the left-right direction.

As illustrated in FIG. 2, the first upper cover 3 includes a first body wall 31 covering the upper opening 5 on the side forward of the first partition wall 7 and the second partition wall 8, and a first peripheral wall 32 standing downward (toward the housing) from the peripheral edge of the first body wall 31. The first body wall 31 is provided in a rectangular shape elongated in the front-back direction. The first peripheral wall 32 has a substantially rectangular tube shape, and has a lower end arranged forward of the front wall 61, outward of the right wall 63 and the left wall 64 in the left-right direction, and rearward of the first partition wall 7. As illustrated in FIG. 4, the lower end of the first peripheral wall 32 is downward of the stepped wall 71 of the first partition wall 7.

As illustrated in FIG. 2, the second upper cover 4 includes a second body wall 41 having a substantially rectangular shape and covering the upper opening 5 on the side rearward of the first partition wall 7 and the second partition wall 8, a first waterproof rib 42 (first upright wall) standing from the second body wall 41, and a second peripheral wall 43. As illustrated in FIG. 4, the first waterproof rib 42 stands upward (away from the housing 2) from the front end of the second body wall 41. The first waterproof rib 42 is overlapped on the rear side of the first partition wall 7 on the side downward of the stepped wall 71.

Figure 6:
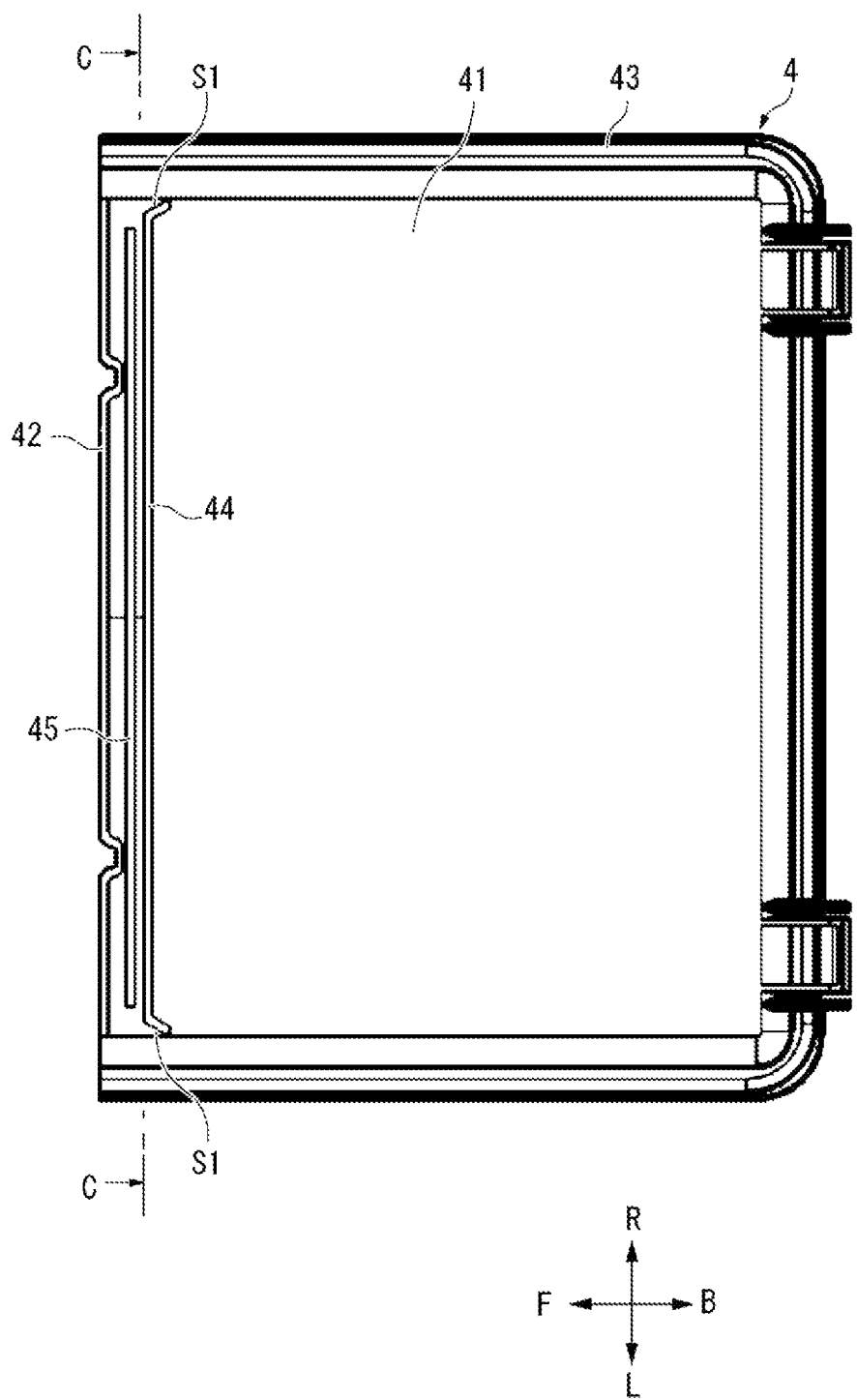
FIG. 6 is a top view of a second upper cover.

That is, the first waterproof rib 42 is arranged between the first partition wall 7 and the first peripheral wall 32 in the front-back direction. The gap between the first waterproof rib 42 and the first partition wall 7 is narrower than the distance between the first waterproof rib 42 and the first peripheral wall 32 in the front-back direction. The upper end of the first waterproof rib 42 protrudes upward of the lower end of the first peripheral wall 32. As illustrated in FIG. 6, the first waterproof rib 42 is provided across both ends in the left-right direction of the second body wall 41. As illustrated in FIG. 2, the second peripheral wall 43 protrudes downward from the left, right and rear ends of the second body wall 41.

Figure 5:
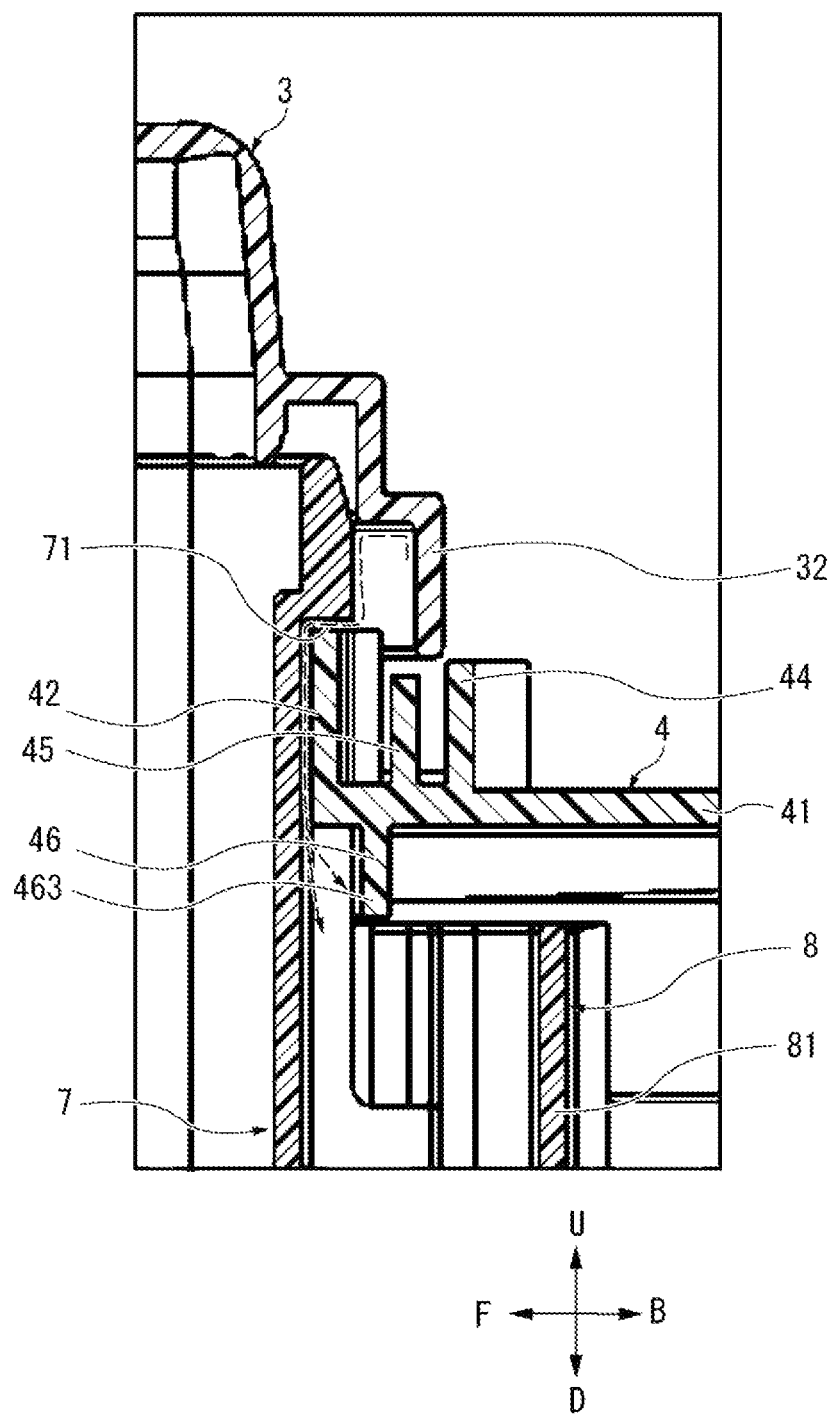
FIG. 5 is a cross-sectional view taken along line B-B of FIG. 1.

As illustrated in FIGS. 4 and 5, the second upper cover 4 includes a second waterproof rib 44 (second upright wall), a third waterproof rib 45 (third upright wall), and a fourth waterproof rib 46 (fourth upright wall) that stand from the second body wall 41. The second waterproof rib 44 stands upward from the second body wall 41 and is orthogonal to the front-back direction. The entire second waterproof rib 44 is entirely arranged rearward of the first peripheral wall 32.

In the present embodiment, the upper end of the second waterproof rib 44 is provided at a position the same as or slightly lower than the lower end of the first peripheral wall 32 in the upper-down direction. The front face of the second waterproof rib 44 and the rear face of the lower end of the first peripheral wall 32 are provided at substantially the same position in the front-back direction. As illustrated in FIG. 6, the second waterproof rib 44 is provided across both ends in the left-right direction of the second body wall 41. In the present embodiment, the second waterproof rib 44 is provided with inclined faces S1 at both ends in the left-right direction in directions away from the first waterproof rib 42 as away from the center in the left-right direction.

As illustrated in FIGS. 4 and 5, the third waterproof rib 45 stands upward from the second body wall 41 between the first waterproof rib 42 and the second waterproof rib 44, and is orthogonal to the front-back direction. The third waterproof rib 45 is arranged forward of the first peripheral wall 32 at the front side thereof. The third waterproof rib 45 is arranged downward of the second waterproof rib 44 at the upper end thereof. In the present embodiment, the gap between the first waterproof rib 42 and the third waterproof rib 45 is wider than the gap between the second waterproof rib 44 and the third waterproof rib 45.

As illustrated in FIG. 6, the third waterproof rib 45 is provided substantially across both ends in the left-right direction of the second body wall 41. In the present embodiment, the left end of the third waterproof rib 45 is provided slightly rightward of the left inclined face S1 of the second waterproof rib 44, and the right end of the third waterproof rib 45 is arranged slightly leftward of the right inclined face S1 of the second waterproof rib 44.

Figure 7:
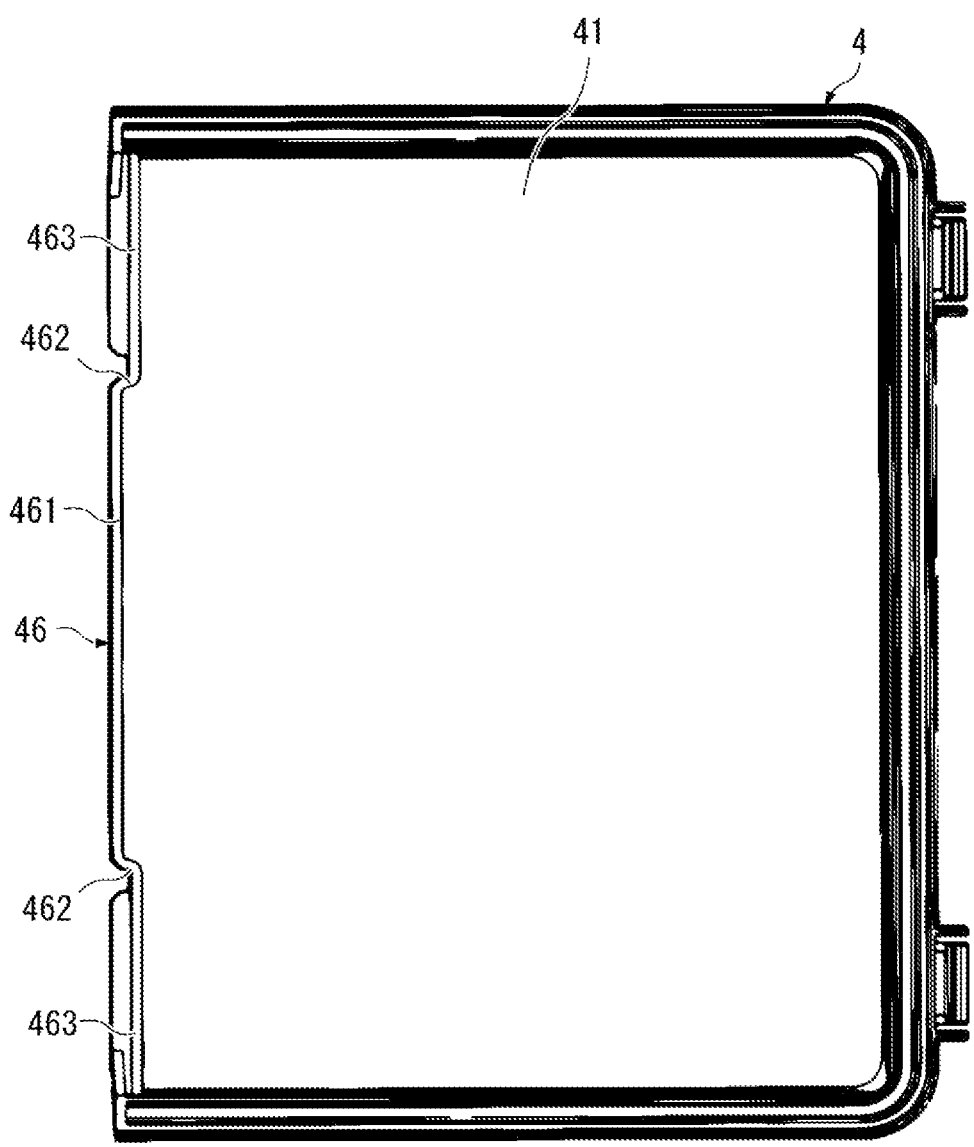
FIG. 7 is a bottom view of a second upper cover.

The fourth waterproof rib 46 stands downward (toward the housing 2) from the front end of the second body wall 41. As illustrated in FIG. 7, the fourth waterproof rib 46 includes a central wall 461, a pair of third stepped walls 462, 462, and a pair of end walls 463, 463. The central wall 461 is provided at the center in the left-right direction of the fourth waterproof rib 46. The central wall 461 is provided at the same position as the first waterproof rib 42 in the front-back direction. The pair of third stepped walls 462, 462 stand rearward from both ends in the left-right direction of the central wall 461. The pair of end walls 463, 463 are provided at both ends in the left-right direction of the fourth waterproof rib 46, and stand outward in the left-right direction from the rear ends of the pair of third stepped walls 462, 462.

As illustrated in FIGS. 4 and 5, the gap between the first partition wall 7 and the central wall 461 is narrower than the gap between the first partition wall 7 and the pair of end walls 463, 463. That is, the gap between the first partition wall 7 and the fourth waterproof rib 46 is wider at both ends in the left-right direction than at the center in the left-right direction.

Figure 8:
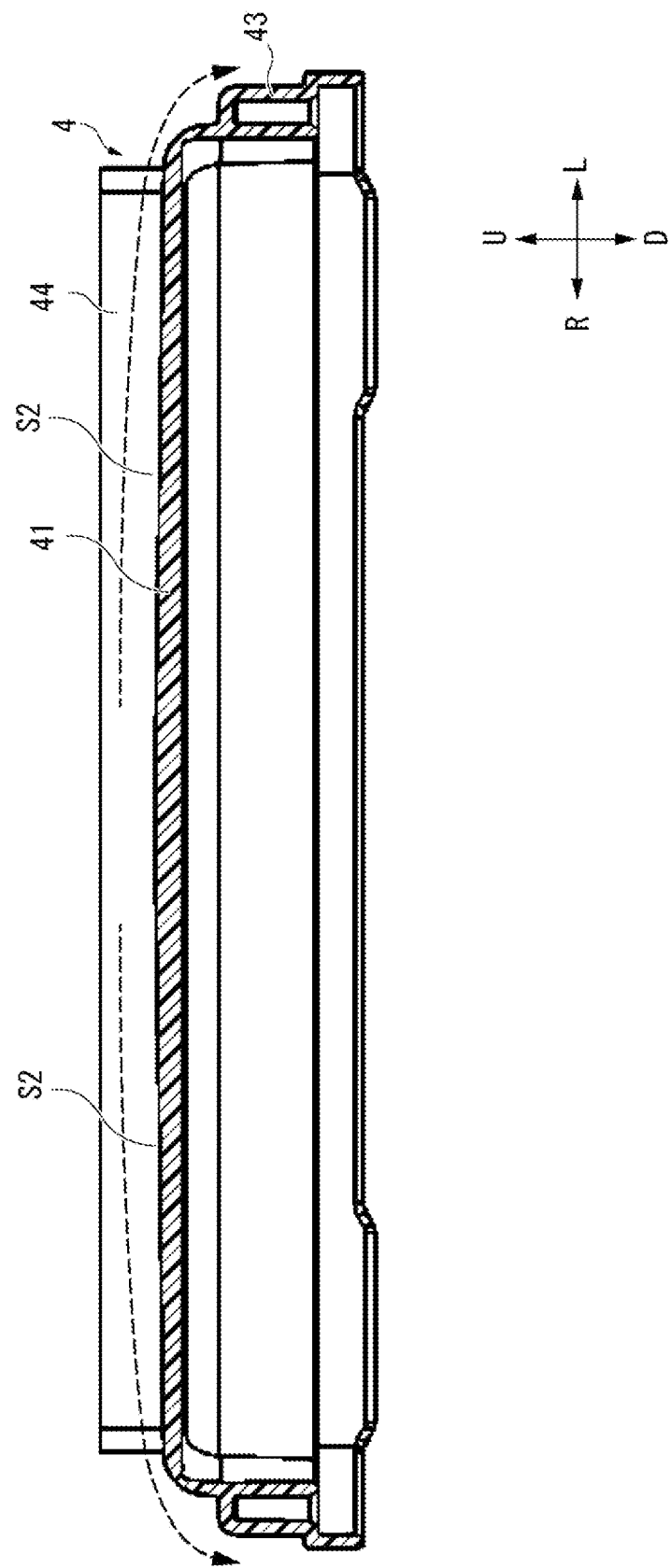
FIG. 8 is a cross-sectional view taken along line C-C of FIG. 5.

As illustrated in FIG. 8, the second body wall between the first waterproof rib 42 and the second waterproof rib 44 is provided with inclined faces S2, S2 that extend downward from the center toward both ends in the left-right direction.

According to the above-described embodiment, the second upper cover 4 includes the second waterproof rib 44 standing upward from the second body wall 41, and the second waterproof rib 44 is arranged backward of the first peripheral wall 32. Thus, as indicated by the arrows in FIG. 4, when water flows rearward from the front, even if the water hits a mounted component 100 arranged above the first upper cover 4 and is directed downward of the second peripheral wall 32, the water is repelled back by the second waterproof rib 44. As a result, the power of water forward from below the first peripheral wall 32 indicated by the dotted arrow in FIG. 4 can be reduced, and water can be prevented from entering the area accommodating the electronic components of the housing 2.

According to the above-described embodiment, the second upper cover 4 includes the third waterproof rib 45 standing upward from the second body wall 41 between the first waterproof rib 42 and the second waterproof rib 44. Due to the third waterproof rib 45, the power of water entering forward from below the first peripheral wall 32 indicated by the dotted arrow in FIG. 4 can be further reduced, and water can be further prevented from entering the area accommodating the electronic components of the housing 2.

According to the above-described embodiment, the housing 2 includes the second partition wall 8 arranged rearward of the first partition wall 7. The second upper cover 4 includes the fourth waterproof rib 46 standing downward from the front edge of the second body wall 41. Thus, as indicated by the dotted arrow in FIG. 4, the water that has passed through the gap between the first waterproof rib 42 and the first partition wall 7 is discharged from the lower end of the fourth waterproof rib 46. The discharged water flows down along the first partition wall 7 due to the surface tension. By providing the fourth waterproof rib 46, it is possible to prevent the water that has passed through the gap between the first waterproof rib 42 and the first partition wall 7 from flowing along the lower face of the second body wall 41 due to the surface tension and entering the area accommodating the electronic components rearward of the second partition wall 8.

According to the above-described embodiment, the second body wall 41 between the first waterproof rib 42 and the second waterproof rib 44 is provided with the inclined faces S2, S2 that extend downward from the center in the left-right direction toward both ends in the left-right direction. Thus, as indicated by the dotted arrows in FIG. 8, the water accumulated between the first waterproof rib 42 and the second waterproof rib 44 can flow toward both ends in the left-right direction along the inclined faces S2, S2, and can be discharged to the outside from both ends in the left-right direction of the second body wall 41.

According to the above-described embodiment, the gap between the first partition wall 7 and the second partition wall 8 is wider at both ends in the left-right direction than at the center in the left-right direction, and the gap between the first partition wall 7 and the fourth waterproof rib 46 is wider at both ends in the left-right direction than at the center in the intersecting direction. Thus, the water is collected at both ends in the left-right direction of the second body wall 41 along the inclined faces S2, S2. A part of the collected water passes through the narrow gap between the first partition wall 7 and the first waterproof rib 42 as indicated by the dotted arrows in FIG. 5. The water that has passed through the narrow gap is released at the upper end of the fourth waterproof rib 46, and is further released at the lower end of the fourth waterproof rib 46. Since the water is released in two stages in this way, the power of the released water can be limited. Further, since the gap between the first partition wall 7 and the second partition wall 8 is wide at both ends in the left-right direction, even if water is released and is exerted with power, the water can be prevented from entering the area accommodating the electronic components rearward of the second partition wall 8.

It should be noted that the present disclosure is not limited to the above embodiment, and modifications, improvements, and the like can be made as appropriate. In addition, materials, shapes, dimensions, numbers, arrangement positions, and the like of the respective constituent elements in the above embodiment are optionally selected and are not limited as long as the present disclosure can be implemented.

Figure 9:
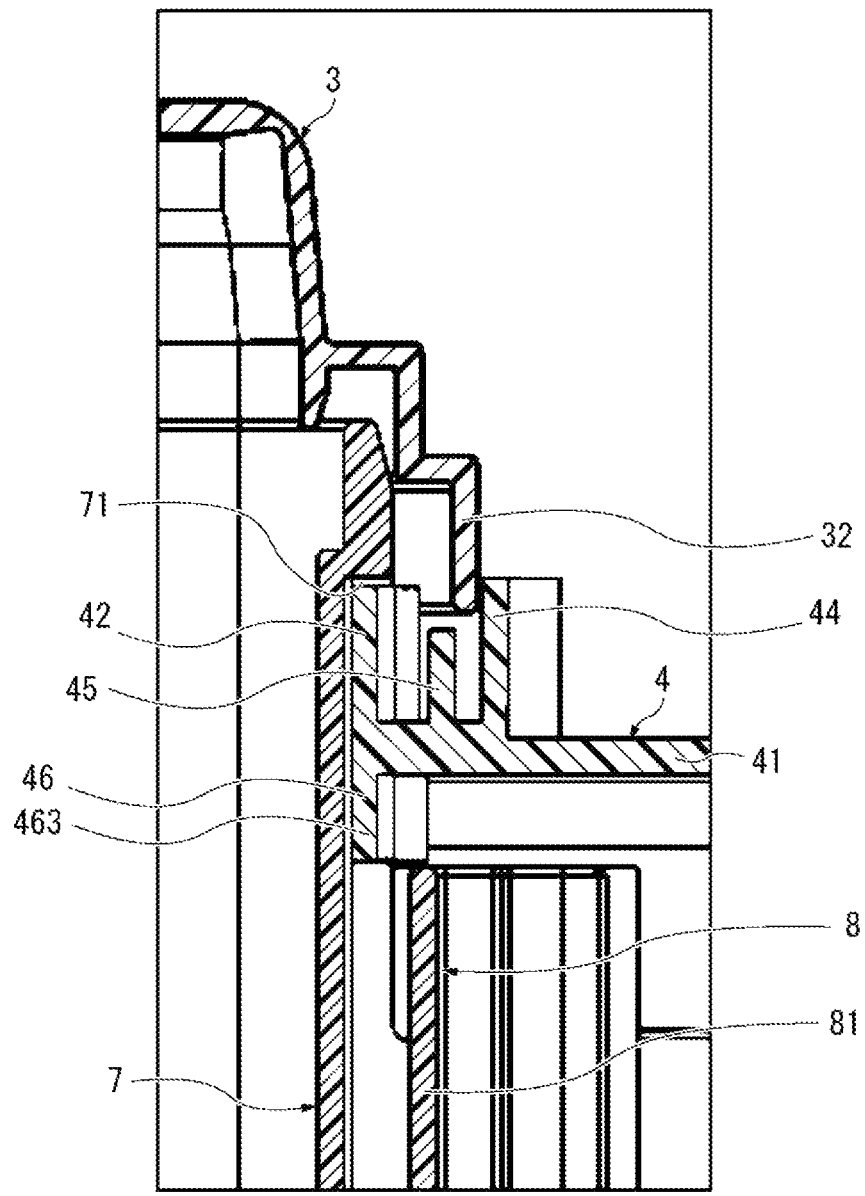
FIG. 9 is a cross-sectional view taken along line A-A of FIG. 1 according to another embodiment.

According to the above-described embodiment, the upper end of the second waterproof rib 44 is provided at a position the same as or slightly lower than the lower end of the first peripheral wall 32 in the upper-down direction, but is not limited thereto. For example, as illustrated in FIG. 9, the upper end of the second waterproof rib 44 may be provided upward of the lower end of the first peripheral wall 32 such that the upper end of the second waterproof rib 44 overlaps with the lower end of the first peripheral wall 32.

According to the above-described embodiment, the second upper cover 4 is provided with the third waterproof rib 45 and the fourth waterproof rib 46, but is not limited thereto. The third waterproof rib 45 and the fourth waterproof rib 46 are not essential, and the second upper cover 4 may be not provided with the third waterproof rib 45 and the fourth waterproof rib 46.

According to the above-described embodiment, the second upper cover 4 is provided with the inclined faces S2, S2, but is not limited thereto. The inclined faces S2, S2 are not essential, and the second upper cover 4 may be not provided with the inclined faces S2, S2.

According to the above-described embodiment, the gap between the first partition wall 7 and the second partition wall 8 is wider at both ends in the left-right direction than at the center in the left-right direction, and the gap between the first partition wall 7 and the fourth waterproof rib 46 is wider at both ends in the left-right direction than at the center in the left-right direction, but is not limited thereto. The gap between the first partition wall 7 and the second partition wall 8 or the gap between the first partition wall 7 and the fourth waterproof rib 46 may be constant from one end through the other end in the left-right direction.

Here, features of the embodiment of the above-described electric junction box according to the present invention will be briefly summarized and listed in <1> to <5> below.

<1>

An electric junction box (1) including:
  a housing (2) including a housing body (6) having an opening (5), and a first partition wall (7) partitioning an interior of the housing body (6) into two areas parallel in a partition direction (front-back direction);
  a first lid (3) including a first body wall (31) covering the opening (5) on one side in the partition direction with respect to (forward of) the first partition wall (7), and a first peripheral wall (32) standing toward the housing (2) (downward) from a peripheral edge of the first body wall (31), the first peripheral wall (32) being arranged on the other side in the partition direction with respect to (rearward of) the first partition wall (7);
  a second lid (4) including a second body wall (41) covering the opening (5) on the other side in the partition direction with respect to (rearward of) the first partition wall (7), and a first upright wall (42) standing away from the housing (2) (upward) from an edge of the second body wall (41) on the one side in the partition direction (front side), the first upright wall (42) being provided between the first partition wall (7) and the first peripheral wall (32) in the partition direction (front-back direction), in which
  the second lid (4) includes a second upright wall (44) standing away from the housing (upward) from the second body wall (41), and
  the second upright wall (44) is arranged on the other side in the partition direction with respect to (rearward of) the first peripheral wall (32).

According to the configuration of the above <1>, when water flows from the one side toward the other side in the front-back direction, even if the water hits the mounted component (100) arranged on the side away from the housing (2) (upper side) of the second lid (4) and is directed toward the housing (2) with respect to (downward of) the first peripheral wall (32), the water is repelled back by the second upright wall (44). As a result, the power of the water directed toward the one side in the front-back direction (forward) from the side closer to the housing 2 of (from below) the first peripheral wall (32) can be reduced, and water can be prevented from entering the area accommodating where the electronic components of the housing (2).

<2>

In the electric junction box (1) according to <1>,
  the second lid (4) includes a third upright wall (45) standing away from the housing (2) (upward) from the second body wall (41) between the first upright wall (42) and the second upright wall (44).

According to the configuration of the above <2>, due to the third upright wall (45), the power of the water entering toward the one side in the front-back direction (forward) from the side closer to the housing 2 of (from below) the first peripheral wall (32) can be further reduced, and water can be further prevented from entering the area accommodating where the electronic components of the housing (2).

<3>

In the electric junction box (1) according to <1> or <2>,
  the housing (2) includes a second partition wall (8) provided closer to the other side in the partition direction than (rearward of) the first partition wall (7), and
  the second lid (4) includes a fourth upright wall (46) standing toward the housing (2) from an edge of the second body wall (41) on the one side in the partition direction (front side).

According to the configuration of the above <3>, the water that has passed through the gap between the first upright wall (42) and the first partition wall (7) is discharged from the end of the fourth upright wall (46) on the side closer to the housing (2), and the discharged water flows down along the first partition wall (7) due to the surface tension. By providing the fourth upright wall (46), it is possible to prevent the water that has passed through the gap between the first upright wall (42) and the first partition wall (7) from flowing along the surface of the second body wall (41) on the side closer to the housing (2) due to the surface tension and entering the area accommodating the electronic components rearward of the second partition wall (8).

<4>

In the electric junction box (1) according to any one of <1> to <3>,
  the second body wall (41) between the first upright wall (42) and the second upright wall (44) is provided with an inclined face (S2, S2) approaching the housing (2) (downward) from a center in an intersecting direction (left-right direction) intersecting the partition direction (front-back direction) toward both ends in the intersecting direction (left-right direction).

According to the configuration of the above <4>, the water accumulated between the first upright wall (42) and the second upright wall (44) can flow toward both ends in the intersecting direction (left-right direction) along the inclined face (S2, S2), and can be discharged to the outside from both ends in the intersecting direction (left-right direction) of the second body wall (41).

<5>

In the electric junction box (1) according to <4>,
  the housing (2) includes a second partition wall (8) provided on the other side in the partition direction with respect to (rearward of) the first partition wall (7),
  the second lid (4) includes a fourth upright wall (46) standing toward the housing (2) (downward) from an edge of the second body wall (41) on the one side in the partition direction (front side),
  a first gap between the first partition wall (7) and the second partition wall (8) is wider at both ends of the first gap in the intersecting direction (left-right direction) than at the center of the first gap in the intersecting direction (left-right direction), and
  a second gap between the first partition wall (7) and the fourth upright wall (46) is wider at both ends of the second gap in the intersecting direction (left-right direction) than at the center of the second gap in the intersecting direction (left-right direction).

According to the configuration of the above <5>, the water is collected at both ends in the intersecting direction (left-right direction) of the second body wall (41) along the inclined face (S2, S2). A part of the collected water passes through the narrow gap between the first partition wall (7) and the first upright wall (42). The water that has passed through the narrow gap is released at the end of the fourth upright wall (46) on the side away from the housing (2) (upper end), and is further released at the end of the fourth upright wall (46) on the side closer to the housing (2) (lower end). Since the water is released in two stages in this way, the power of the released water can be limited. Further, since the gap between the first partition wall (7) and the second partition wall (8) is wide at both ends in the intersecting direction (left-right direction), even if water is released and is exerted with power, the water can be prevented from entering the area accommodating the electronic components on the other side in the partition direction with respect to (rearward of) the second partition wall (8).

What is claimed is:

1. An electric junction box comprising:
   a housing including a housing body having an opening, and a first partition wall partitioning an interior of the housing body into two areas parallel in a partition direction;
   a first lid including a first body wall covering the opening on one side in the partition direction with respect to the first partition wall, and a first peripheral wall standing toward the housing from a peripheral edge of the first body wall, the first peripheral wall being arranged on the other side in the partition direction with respect to the first partition wall; and
   a second lid including a second body wall covering the opening on the other side in the partition direction with respect to the first partition wall, and a first upright wall standing away from the housing from an edge of the second body wall on the one side in the partition direction, the first upright wall being provided between the first partition wall and the first peripheral wall in the partition direction, wherein
   the second lid includes a second upright wall standing away from the housing from the second body wall, and the second upright wall is arranged on the other side in the partition direction with respect to the first peripheral wall.

2. The electric junction box according to claim 1, wherein the second lid includes a third upright wall standing away from the housing from the second body wall between the first upright wall and the second upright wall.

3. The electric junction box according to claim 1, wherein the housing includes a second partition wall provided closer to the other side in the partition direction than the first partition wall, and
   the second lid includes a fourth upright wall standing toward the housing from an edge of the second body wall on the one side in the partition direction.

4. The electric junction box according to claim 1, wherein the second body wall between the first upright wall and the second upright wall is provided with an inclined face approaching the housing from a center in an intersecting direction intersecting the partition direction toward both ends in the intersecting direction.

5. The electric junction box according to claim 4, wherein the housing includes a second partition wall provided on the other side in the partition direction with respect to the first partition wall,
   the second lid includes a fourth upright wall standing toward the housing from an edge of the second body wall on the one side in the partition direction,
   a first gap between the first partition wall and the second partition wall is wider at both ends in the intersecting direction than at the center in the intersecting direction, and
   a second gap between the first partition wall and the fourth upright wall is wider at both ends in the intersecting direction than at the center in the intersecting direction.

* * * * *